(12) United States Patent
Grosse et al.

(10) Patent No.: US 6,934,142 B2
(45) Date of Patent: Aug. 23, 2005

(54) DEVICE AND METHOD FOR CHARGE REMOVAL FROM DIELECTRIC SURFACES

(75) Inventors: Stefan Grosse, Gerlingen (DE); Sascha Henke, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/258,309

(22) PCT Filed: Feb. 14, 2002

(86) PCT No.: PCT/DE02/00520
§ 371 (c)(1),
(2), (4) Date: Jun. 24, 2003

(87) PCT Pub. No.: WO02/067285
PCT Pub. Date: Aug. 29, 2002

(65) Prior Publication Data
US 2004/0141278 A1 Jul. 22, 2004

(30) Foreign Application Priority Data
Feb. 23, 2001 (DE) .......................... 101 08 717

(51) Int. Cl.⁷ .............................................. H02H 3/00
(52) U.S. Cl. ................................................... 361/213
(58) Field of Search ........................ 361/212–214, 361/216, 220, 221, 231; 264/1, 36; 271/18.1

(56) References Cited

U.S. PATENT DOCUMENTS

| 4,012,666 A | | 3/1977 | Schramm et al. ............ 361/213 |
| 4,027,201 A | * | 5/1977 | Bacon et al. ................ 361/213 |
| 4,472,756 A | * | 9/1984 | Masuda ....................... 361/212 |
| 5,159,196 A | | 10/1992 | Kolbenschlag .............. 361/213 |
| 5,872,426 A | * | 2/1999 | Kunhardt et al. ............ 313/582 |

FOREIGN PATENT DOCUMENTS

| DE | 199 43 953 | | 4/2001 | ............ H05H/1/46 |
| DE | 101 08 717 C1 | * | 7/2002 | ............ H05F/3/04 |
| JP | 05 086 470 | | 4/1993 | ............ C23C/14/56 |
| WO | WO 01 20640 | | 3/2001 | ............ H01J/37/32 |
| WO | WO 01/20640 A1 | * | 3/2001 | ............ H01J/37/32 |

OTHER PUBLICATIONS

WO 01/20640 A1 Grosse et al. Mar. 22, 2001 H01J 37/32.*

* cited by examiner

*Primary Examiner*—Ronald Leja
(74) *Attorney, Agent, or Firm*—Kenyon & Kenyon

(57) ABSTRACT

A device and a method for at least partial removal of electric charges from dielectric surfaces, in particular surfaces of plastic films, paper webs or plastic fibers are described. First, a plasma is generated through microstructure discharges with a plasma device in at least one plasma region. In addition, the dielectric surface is introduced into the plasma region with a feed mechanism and is temporarily exposed to electrically charged particles generated by the plasma there.

28 Claims, 3 Drawing Sheets

DEVICE AND METHOD FOR CHARGE REMOVAL FROM DIELECTRIC SURFACES

FIELD OF THE INVENTION

The present invention relates to a device and a method for at least partial removal of electric charges from dielectric surfaces.

BACKGROUND INFORMATION

Nonconducting substances such as surfaces of plastic films, paper webs, or plastic fibers may develop an electric charge at the surface by coming in contact with other substances or due to rapid separation from one another, and the resulting electric voltage on such surfaces may reach a few megavolts. "Natural" unassisted charge removal may take a few hours to days, depending on atmospheric humidity, the type of material and the magnitude of the electric charge.

The electric charge buildup on surfaces may also result in a disturbance in the systems used as well as constitute a health risk to people working on these systems in the production and/or processing of those surfaces. Furthermore, handling is much more difficult due to the electric charge on the surface and the resulting electrostatic forces, in particular in the case of plastic films, paper webs, or plastic fibers, such as those widely used in the packaging industry.

To minimize the surface charge buildup, it is known from the related art that charge removal devices which blow ionized air over the charged surface may be used. Due to the resulting increase in conductivity of the air, a rapid charge removal with a resulting residual voltage of typically a few kV is achieved, depending on the boundary conditions. The limit of a few kV depends on the particular method used, because a voltage of several kV is necessary for ionization of air and/or process gases used as an alternative.

A device for producing a plasma and in particular for treatment or activation of surfaces has been proposed in unpublished German Patent Application No. 199 43 953, where microstructure discharges are produced by injection of microwaves into a hollow conductor provided with through-bores with simultaneous supply of gas. Therefore, a locally limited or planar gas plasma prevails in the vicinity of the through-bores in the particular plasma regions.

SUMMARY OF THE INVENTION

The device and method according to the present invention have the advantage over the related art that they yield an optimized charge removal from dielectric surfaces, in particular surfaces of plastic films, paper webs, or plastic fibers with regard to the magnitude of the electric residual voltage, i.e., the electric charge remaining at the surface and thus also yield a definite improvement in manufacturing stability and simplified handling of such dielectric materials. To this extent, the device and method according to the present invention are suitable for use in the packaging industry in particular.

In this connection, a dielectric surface, i.e., a dielectric material is understood to be a surface, i.e., a material which does not conduct electricity or is a poor conductor with regard to the dissipation of charges applied to the surface.

By temporarily exposing the dielectric surface to a plasma in the immediate vicinity of the surface of the plasma device or at least to the active region of the plasma with regard to the bombardment with electric charges produced by the plasma, the residual electric charge on the dielectric surface from which the charge is to be at least partially removed is reduced to less than 1 kV, in particular less than 500 V, which is a significant improvement in comparison with the residual voltage of a few kilovolts achievable on such surfaces in the related art.

In addition, the method according to the present invention has the advantage that typical treatment times of 0.1 s to 10 s, in particular 0.5 s to 2 s, which are definitely shortened in comparison with the related art, are sufficient to guarantee adequate removal of electric charges from the dielectric surface to be treated. In particular, continuous treatment of continuous films or webs of a dielectric material using the device according to the present invention is also possible.

Moreover, due to the removal of electric charges from dielectric surfaces performed according to the present invention, activation of these surfaces in particular with regard to the surface energy and cleanliness is also achieved at the same time, which is manifested in improved imprintability and increased hydrophilic characteristics, for example.

Finally, the device according to the present invention has the advantage of a simple and modular design, so it is integratable into existing manufacturing systems without requiring complex equipment. Furthermore, the method according to the present invention may also be used in air at atmospheric pressure.

It is especially advantageous if microstructure discharges, i.e., plasma discharges produced by microstructures are used; these are caused by input of an electric voltage at an amplitude of 100 V to 2000 V, in particular 200 V to 700 V. Such a low voltage results in the electric charge, i.e., the electric voltage on the dielectric surface being removed and/or dissipated, in particular via one of the electrodes of the plasma device, due to the conductivity of the plasma created above the surface, while no high, i.e., relevant new charge buildup is caused by the plasma.

With regard to an optimized homogeneity of the plasma thus produced and an improved efficiency of the removal of electric charges from the dielectric surface thus achieved, it is also advantageous if this work is performed at a low partial vacuum of 100 mbar to 900 mbar in particular. In addition it is advantageous if instead of air, nitrogen or, especially advantageously, argon or helium is used as the gas to generate a plasma which is as homogeneous and stable as possible.

To generate the plasma in the plasma regions of the plasma device, a direct voltage or a high-frequency alternating voltage at a frequency of preferably 1 kHz to 100 MHz, in particular 1 MHz to 20 MHz, e.g., 13.45 MHz is preferred. In addition, the plasma may also be generated to advantage by injection of microwaves into the plasma device. In generating the plasma by using an alternating voltage, there is also the advantageous option of providing a thin dielectric protective layer on the electrodes.

DETAILED DESCRIPTION

Figure 1:
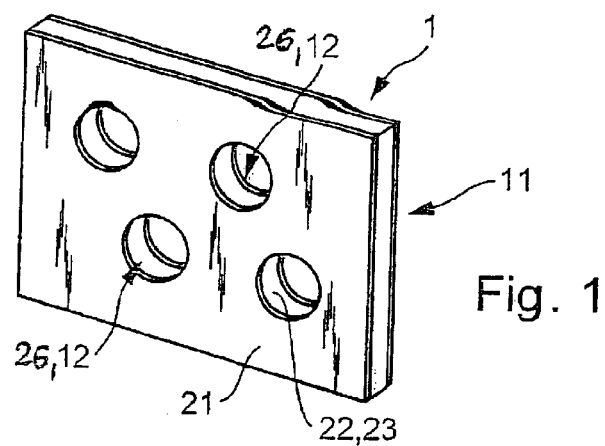
FIG. 1 shows a basic diagram of a first plasma device.

FIG. 1 shows a plasma device 1 having a dielectric plate 22 made of a low-loss puncture proof dielectric such as silicon dioxide or an aluminum oxide, for example. Dielectric plate 22 is also provided with a planar first electrode 11 on one of its surfaces and a planar second electrode 21 on the diametrically opposite surface. Electrodes 11, 21 are made of a metal such as copper, high-grade steel, gold, or silver, for example, and are applied in the form of a coating 10 $\mu$m to 200 $\mu$m thick on the surface of dielectric plate 22, which is typically approx. 0.05 mm to 2 mm thick.

FIG. 1 also shows that electrodes 11, 21 and dielectric plate 22 are provided with a plurality of common through-bores 26. These through-bores 26 are preferably laid out in a regular pattern and have a typical diameter of approx. 40 $\mu$m to 1 mm. Thus on the whole dielectric plate 22 is provided with microstructured planar electrodes 11, 21.

To generate a plasma, electrodes 11, 21 in FIG. 1 are connected to a voltage source (not shown) which supplies electrodes 11, 21 with a direct voltage or a high-frequency alternating voltage at a frequency of 1 kHz to 100 MHz, in particular 13.45 MHz. A direct voltage is preferred. The electric voltage applied is between 100 V and 2000 V, in particular 200 V to 700 V.

A plasma is ignited and maintained in the area of through-bores 26 by the electric voltage applied, so that locally limited plasma regions 12 are formed there. These plasma regions 12 extend into the area of through-bores 26 and also into the vicinity of through-bore 26. In particular, they are elevated above the surface of plasma device 1 on at least one side.

Due to a suitable system and a suitable spacing of through-bores 26 it is also possible and preferable that plasma regions 12 are combined by feedthrough to form a larger planar plasma region 40 which extends, for example, over the entire surface of plasma device 1 on one side and has a typical thickness of 0.5 mm to 3 mm.

According to FIG. 1, inside walls 23 of through-bores 26 may be provided with a protective dielectric layer if necessary, in particular a ceramic coating made of aluminum oxide or silicon dioxide, for example.

Figure 2:
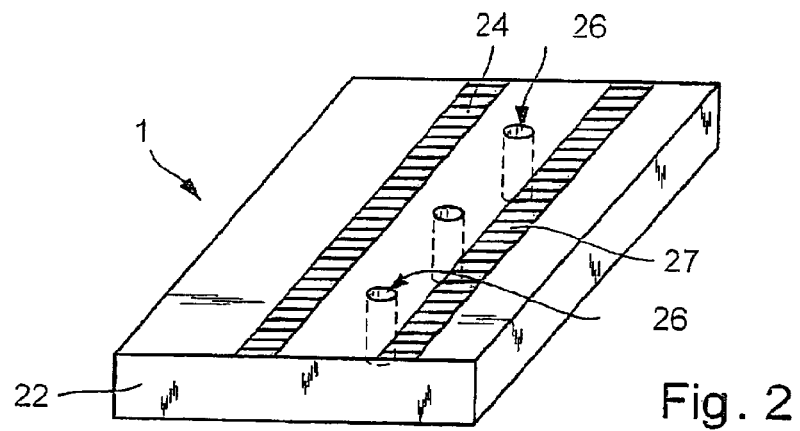
FIG. 2 shows an alternative embodiment of a plasma device.

FIG. 2 illustrates an alternative embodiment of plasma device 1, strips in the form of a first strip conductor 24 and a second strip conductor 27 spaced a distance apart running on dielectric plate 22 made of silicon dioxide or aluminum oxide. These strip conductors 24, 27 thus form microstructured planar electrodes similar to those of FIG. 1.

Figures 3, 4:
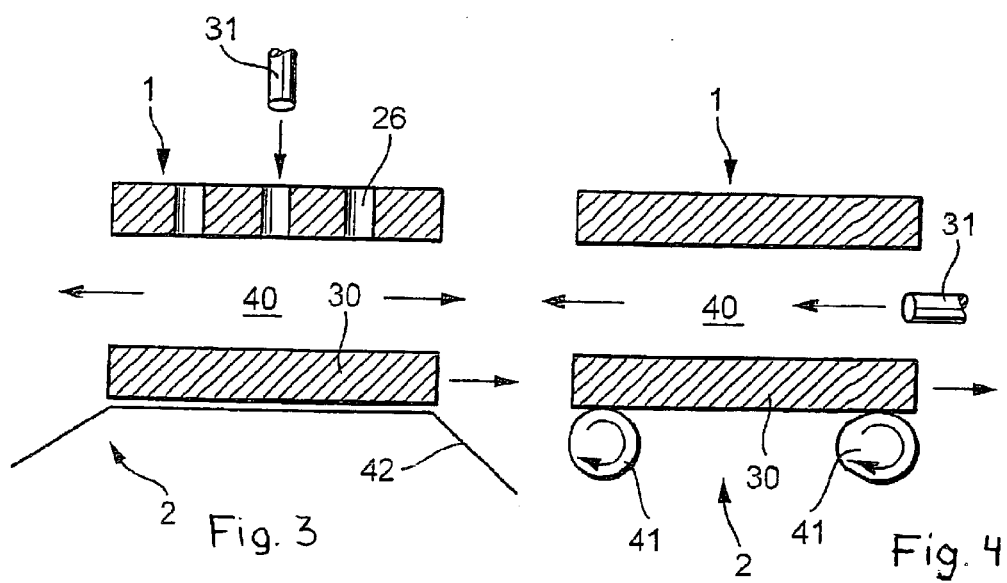
FIG. 3 shows a basic diagram of a charge removal device as a first embodiment.
FIG. 4 shows another embodiment of a charge removal device.

FIG. 2 also shows that a plurality of through-bores 26 is provided between strip conductors 24, 27 so that a gas such as compressed air, nitrogen, argon, or helium, for example, may be introduced through them into the area between strip conductors 24, 27. However, the gas flow may also be parallel to the surface of plasma device 1 as illustrated in FIG. 4.

By applying an electric voltage according to FIG. 1, a plasma is ignited between strip conductors 24, 27, so that plasma regions develop between strip conductors 24, 27 at least in the vicinity of through-bores 26, in particular between strip conductors 24, 27. Through a suitable system of through-bores 26 and a suitably adapted spacing of strip conductors 24, 27 it is also possible here, by analogy with FIG. 1, and the plasma regions are preferably combined to form a planar plasma region 40.

Strip conductors 24, 27 according to FIG. 2 are composed of, for example, sheets of copper or gold, optionally applied to a galvanic reinforcement, e.g., made of nickel.

Another exemplary embodiment (not shown here) of a plasma device 1 has planar electrodes spaced a distance apart by insulating layers provided in some areas between them and acted upon by an electric voltage, so that a plasma is ignited and maintained in the remaining interspace between the electrodes, which is filled with gas and/or has gas flowing over it, as explained above, this plasma then being utilized for removal of electric charges from dielectric surfaces. In particular within the context of this exemplary embodiment, a plurality of similar metallic disks having a diameter of 5 mm to 30 mm and a thickness of 0.1 mm to 2 mm and provided with a central bore, for example, may be laid out in a row side by side on a common axis, these disks being spaced a distance apart by using similar dielectric disks, e.g., made of aluminum oxide having a smaller diameter and a thickness of 0.1 mm to 3 mm, for example, likewise in a row with a central bore on the axis, so that by applying an electric voltage to the metallic disks having alternating polarities, a plasma burns between these disks in the interspaces not occupied by the dielectric disks. Therefore, a discharge rod is formed as plasma device 1, which may be guided over a dielectric surface which is to be discharged, or, such a surface may be passed by it. The abovementioned axis is, for example, a ceramic rod having a diameter corresponding to that of the central bore, alternately carrying the metallic disks and the dielectric disks.

Figure 7:
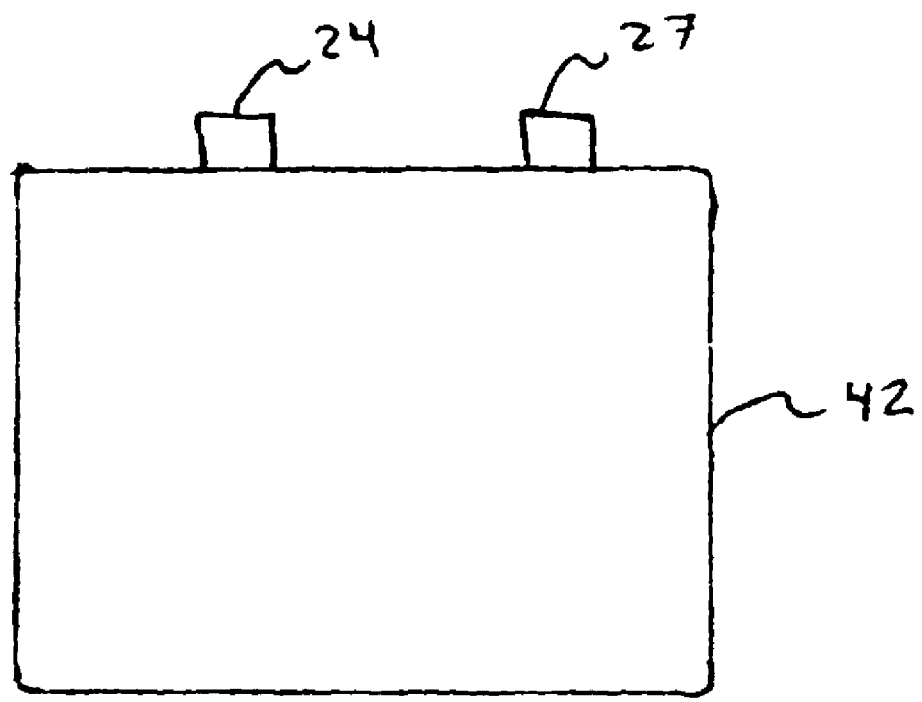
FIG. 7 shows a highly schematic hollow conductor including strip conductors.

Finally, plasma device 1 may also be designed in the form of a hollow conductor for microwaves, preferably filled in the interior with a dielectric plate of silicon dioxide. In this case, through-bores like those in FIGS. 1 and/or 2 are also provided, being introduced into the hollow conductor and/or the dielectric plate. For details regarding such a plasma device having a hollow conductor for microwaves, reference is made to German Patent Application 199 43 953.2. A hollow conductor 42 having strip conductors 24 and 27 for microwaves is shown in a highly schematic manner in FIG. 7.

It is also possible to omit filling the hollow conductor with the dielectric plate because discharges always occur, preferably at the edges of the through-bores, due to field inhomogeneities.

Finally, there is also the possibility of injecting microwaves via strip conductors such as those illustrated in FIG. 2 and thus generating a plasma for the desired removal of electric charges.

All plasma devices 1 described here have in common the fact that charge removals, in particular microstructure discharges, are induced and maintained by supplying a gas and through input of a direct or alternating electric voltage, so that mutually isolated or cohesive plasma regions 12 and/or 40 are formed in the vicinity of the surface of plasma device 1. In particular, when through-bores 26 and the system of microstructured electrodes 11, 21, 24, 27 are selected suitably, feedthrough of the plasmas generated in local plasma regions 12 occurs so that a laterally homogeneous plasma develops in a planar plasma region 40.

It should also be emphasized that an inhomogeneous and/or unstable plasma is also frequently sufficient for removal of electric charges from dielectric surfaces, because adequate contact with the plasma and thus a charge removal process for this dielectric surface are ensured by diffusion of electrically charged particles generated by the plasma and/or time averaging.

It should be emphasized in particular that the dielectric surface need not necessarily be in direct contact with the plasma thus generated in the desired electric charge removal process, i.e., it need not be brought directly into plasma regions 12, 40. Instead, it is sufficient if the surface from which the charge is to be removed is merely introduced into the active area of the plasma, i.e., brought into the diffusion area of the ionized gases, i.e., electrically charged particles in the plasma. In this active area, diffusion of the gases enriched with ions out of the actual plasma region to the dielectric surface situated in proximity to plasma device 1 occurs, thus also resulting in a charge removal, although it is less effective in comparison with (that of) direct plasma region 12, 40. In individual cases, an expansion of the effective area due to gas diffusion or particle diffusion of up to 10 cm is observed with a spatial expansion of the actual plasma region, typically amounting to a few mm in one dimension.

FIG. 3 illustrates a first exemplary embodiment of a device according to the present invention for at least partial removal of electric charges from dielectric surfaces on the example of charge removal from a plastic film 30. Plastic film 30 is pulled over a sliding table 42 by a transport device (not shown), where the dielectric surface of plastic film 30 is acted upon by a plasma on its side facing away from sliding table 42 by using a plasma device 1 according to FIG. 1 or FIG. 2. The distance of plasma device 1 from the surface of plastic film 30 passed by it typically amounts to 0.1 mm to 5 mm, in particular 0.5 mm to 2 mm.

In removing charges from the surface of plastic film 30 using plasma device 1 according to FIG. 3, the electrode of plasma device 1 facing plastic film 30 is preferably grounded, and in the case of a direct voltage excitation, the electrode facing the film receives a positive voltage, so an especially intense charge removal burns in plasma region 40. In addition, an electric potential close to ground potential prevails there. This yields an especially effective charge removal from the surface of plastic film 30.

According to FIG. 3, a gas such as compressed air, nitrogen, argon or helium is supplied to plasma device 1 from its side facing away from plastic film 30 through a gas feed 31, then flowing through through-bores 26. In this way, a laterally homogeneous plasma extending over the vicinity of the surface of plasma device 1 in plasma region 40 develops in particular on the side of plasma device 1 facing plastic film 30. In addition, at least partial removal of electric charges from the dielectric surfaces is achieved through the arrangement of plasma device 1 and sliding table 42, which in the example described here functions as a feed mechanism 2, the dielectric surface of plastic film 30 is exposed to this plasma in plasma region 40.

According to FIG. 3, plastic film 30 is preferably drawn continuously in the form of a web over sliding table 42, so that its surface is acted upon temporarily by the plasma thus produced on one side.

A typical time for at least partial removal of electric charges from the dielectric surface of the plastic film has been found to be 0.1 to 10 s, in particular 0.5 s to 2 s, which is easily adjustable via the rate of conveyance at which the plastic film is drawn over sliding table 42. Likewise, however, multiple modules of plasma device 1 may be connected in series to ensure an adequate removal of electric charges at a fixed rate of conveyance.

Figure 5:
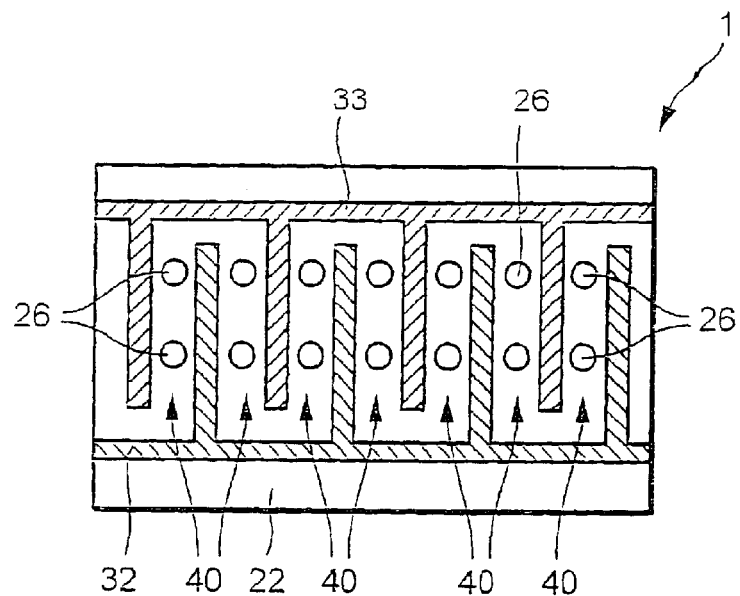
FIG. 5 shows another embodiment of a plasma device as an alternative to those in FIGS. 1 and 2.

In addition, plasma device 1 according to FIG. 3 and/or also according to additional FIGS. 4 and 5 may be designed to be planar, as shown here, or curved or adapted to the possibly complex geometry, to meet the needs of feed mechanism 2.

FIG. 4 illustrates an alternative embodiment to that of FIG. 3, where conveyor rollers 41 are provided instead of sliding table 42, functioning as a feed mechanism 2 for supplying plastic film 30 into plasma region 40 of the plasma generated by plasma device 1. In addition according to FIG. 4 gas feed 31 also blows a gas into the interspace between plasma device 1 and plastic film 30. This also ensures continuous processing of a continuous plastic film 30.

FIG. 5 shows a third embodiment of a plasma device 1 which differs from the embodiment according to FIG. 2 only in the system of through-bores 26 and the structure of the planar microstructured electrodes. Specifically, according to FIG. 5, a first comb 32 and a second comb 33 are provided on the surface of dielectric plate 22, forming an intermeshing comb structure, with through-bores 26 located between the individual elongated teeth of combs 32, 33. The spacing of the teeth of combs 32 and 33 according to FIG. 5 is preferably between 20 $\mu$m and 200 $\mu$m, e.g., 100 $\mu$m. Otherwise, combs 32, 33 are designed like strip conductors 24, 27.

Due to the comb structure according to FIG. 5, a planar, especially homogeneous plasma region 40 is created on the surface of plasma device 1, extending to a distance of approx. 0.5 mm to 3 mm from the surface of plasma device 1.

Figure 6:
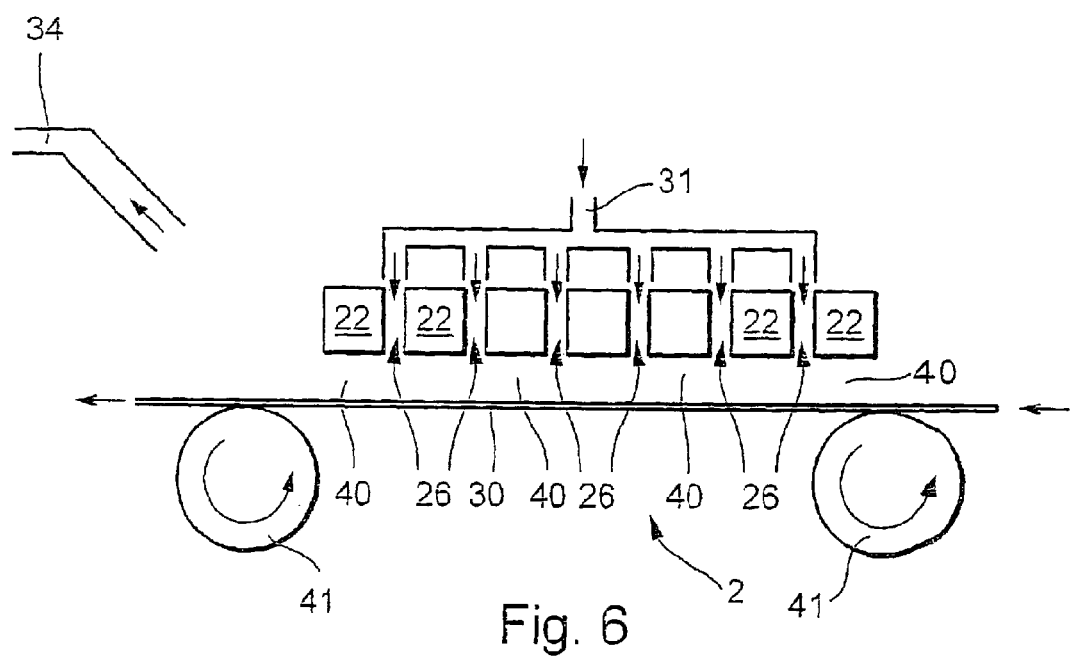
FIG. 6 shows a third embodiment of a charge removal device having the plasma device according to FIG. 5.

Finally FIG. 6 shows a third embodiment of a device for removing charges from a plastic film 30 using a plasma device 1 according to FIG. 5. The comb structure having combs 32, 33 is situated on the side of plasma device 1 facing plastic film 30. In addition, plastic film 30 is conveyed over conveyer rollers 41 on the surface of plasma device 1 at a distance of approximately 1 mm, so that the surface of plastic film 30 is introduced continuously into plasma are 40 and is exposed to the plasma prevailing there. In addition, FIG. 6 shows that a gas, e.g., helium, is supplied through a gas feed 31 to the plastic film from the side of plasma device 1 facing away from plastic film 30. Gas feed 31, e.g., in the form of a suitably designed gas spray, produces a supply of this gas to through-bores 26 according to FIG. 5. Finally, according to FIG. 6, the gas supplied with gas feed 31 is removed again through a gas suction device 34. This gas suction device 34 is especially relevant when the gas supplied is air, because in this case ozone is formed in the device described here.

FIG. 6 is especially suitable for continuously passing paper webs or plastic films over the surface of plasma device 1. This achieves removal of surface charges on the side of plastic film 30 facing plasma device 1 via the plasma produced at the surface.

In conclusion, it should also be pointed out that the device according to the present invention may be operated at atmospheric pressure as well as at a partial vacuum of 100 mbar to 900 mbar, for example, yielding an improvement in the homogeneity of the plasma produced and the efficiency in generating the plasma. On the other hand, working under partial vacuum requires more complex equipment because a suitable processing chamber having a pumping mechanism are usually required.

Furthermore, it should be emphasized that through-bores 26 in the exemplary embodiments described here may also be designed as slots, elongated recesses, semicircular recesses, etc., in addition to the circular holes described here.

What is claimed is:

1. A device for performing at least a partial removal of an electric charge from a dielectric surface, comprising:
a plasma device for generating a plasma containing electrically charged particles in at least one plasma region using microstructures;
a feed mechanism with which the dielectric surface is introducible one of into the at least one plasma region and at least into an effective region thereof, at which the dielectric surface is temporarily exposable to the electrically charged particles generated by the plasma;
a gas feed for supplying a gas to the at least one plasma region; and
a gas suction device for removal of the gas.

2. The device as recited in claim 1, wherein:
the dielectric surface includes one of a plastic film surface, a paper web surface, and a plastic fiber surface.

3. The device as recited in claim 1, wherein the plasma device includes:
a dielectric plate,
a first electrode exposed to a gas,
at a distance from the first electrode, a second electrode exposed to the gas, and
an arrangement for igniting and maintaining the plasma in the plasma region.

4. The device as recited in claim 3, wherein:
one of the first electrode and the second electrode includes planar microstructured electrodes.

5. The device as recited in claim 4, wherein:
the planar microstructured electrodes include at least one of:
one of strips and strip conductors spaced a distance apart, and
combs spaced apart by the distance in a comb structure.

6. The device as recited in claim 4, wherein:
the first electrode and the second electrode include planar electrodes having microstructured recesses corresponding to one of holes, through-bores, and slots on two diametrically opposed sides.

7. The device as recited in claim 3, wherein:
the dielectric plate includes at least one through-bore corresponding to a plurality of through-bores having a diameter of 10 $\mu$m to 300 $\mu$m, the at least one through-bore at least one of forming a microstructured recess in each of the first electrode and the second electrode and being situated in a vicinity of the first electrode and the second electrode.

8. The device as recited in claim 3, wherein:
the dielectric plate includes a plurality of through-bores having a diameter of 10 $\mu$m to 300 $\mu$m, the through-bores at least one of forming a microstructured recess in each of the first electrode and the second electrode and being situated in a vicinity of the first electrode and the second electrode.

9. The device as recited in claim 1, wherein:
the plasma device includes one of at least one hollow conductor and an arrangement of strip conductors for microwaves.

10. The device as recited in claim 1, wherein:
the feed mechanism includes an arrangement for continuously passing the dielectric surface past a surface of the plasma device so that the dielectric surface is temporarily exposed to one of the plasma in the at least one plasma region and at least to an effective area of the electrically charged particles generated by the plasma.

11. The device as recited in claim 1, wherein:
the gas feed is arranged to blow a gas into an interspace between the plasma device and the dielectric surface.

12. The device as recited in claim 1, wherein:
plasma is generated by injection of microwaves into the plasma device.

13. The device as recited in claim 1, further comprising:
electrodes each having a thin dielectric protective layer.

14. A method for at least partially removing an electric charge from a dielectric surface, comprising:
causing a plasma device including microstructures to generate a plasma in at least one plasma region;
supplying a gas via a gas feed to the at least one plasma region;
temporarily exposing the dielectric surface to the plasma in at least one of the at least one plasma region and at least in an effective area thereof; and
removing the gas via a gas suction device.

15. The method as recited in claim 14, further comprising one of:
generating a plurality of locally limited plasmas in the at least one plasma region in a vicinity of a surface of the plasma device; and
generating a planar plasma in another plasma region in the vicinity of the surface of the plasma device.

16. The method as recited in claim 14, wherein:
the plasma is ignited and maintained by injecting an electric voltage having an amplitude of 100 volts to 2000 volts into the plasma device in the at least one plasma region.

17. The method as recited in claim 14, wherein:
the plasma is ignited and maintained by injecting an electric voltage having an amplitude of 200 volts to 700 volts into the plasma device in the at least one plasma region.

18. The method as recited in claim 14, wherein:
one of a direct voltage and a high-frequency alternating voltage is injected at a frequency of 1 kHz to 100 MHz.

19. The method as recited in claim 14, wherein:
one of a direct voltage and a high-frequency alternating voltage is injected at a frequency of 13.45 MHz.

20. The method as recited in claim 14, further comprising:
exposing the dielectric surface from which the electric charge is to be at least partially removed to the plasma in the at least one plasma region for a period of 0.1 sec to 10 sec.

21. The method as recited in claim 14 further comprising:
exposing the dielectric surface from which the electric charge is to be at least partially removed to the plasma in the at least one plasma region for a period of 0.5 sec to 2 sec.

22. The method as recited in claim 14, further comprising:
wherein the gas including one of air, nitrogen, argon, and helium.

23. The method as recited in claim 14, further comprising:
guiding the dielectric surface past a surface of the plasma device at a distance of 100 $\mu$m to 5 mm; and
exposing the dielectric surface to the plasma in the at least one plasma region.

24. The method as recited in claim 14, further comprising:
guiding the dielectric surface past a surface of the plasma device at a distance of 500 $\mu$m to 2 mm; and exposing the dielectric surface to the plasma in the at least one plasma region.

25. The method as recited in claim 14, wherein:

the method is implemented at a partial vacuum that is at 100 mbar to 900 mbar.

26. The method as recited in claim 14, wherein:

the gas supplying step includes blowing a gas into an interspace between the plasma device and the dielectric surface.

27. The method as recited in claim 14, wherein:

the plasma device is caused to generate the plasma by injecting microwaves into the plasma device.

28. The method as recited in claim 14, wherein:

the microstructures include electrodes each having a thin dielectric protective layer.

* * * * *